(12) United States Patent
Chaubey et al.

(10) Patent No.: US 9,034,105 B2
(45) Date of Patent: May 19, 2015

(54) SOLID PRECURSOR SUBLIMATOR

(75) Inventors: Trapti Chaubey, Wilmington, DE (US); Mindi Xu, Naperville, IL (US)

(73) Assignee: American Air Liquide, Inc., Fremont, CA (US)

( * ) Notice: Subject to any disclaimer, the term of this patent is extended or adjusted under 35 U.S.C. 154(b) by 1756 days.

(21) Appl. No.: 12/351,723

(22) Filed: Jan. 9, 2009

(65) Prior Publication Data

US 2009/0181168 A1    Jul. 16, 2009

Related U.S. Application Data

(60) Provisional application No. 61/020,339, filed on Jan. 10, 2008, provisional application No. 61/093,960, filed on Sep. 3, 2008.

(51) Int. Cl.
   *C23C 16/00* (2006.01)
   *C23C 16/448* (2006.01)

(52) U.S. Cl.
   CPC .................. *C23C 16/4481* (2013.01)

(58) Field of Classification Search
   USPC .......................................... 118/726
   See application file for complete search history.

(56) References Cited

U.S. PATENT DOCUMENTS

| | | | |
|---|---|---|---|
| 3,003,249 A | 10/1961 | Templeton | |
| 5,377,429 A | 1/1995 | Sandhu et al. | |
| 5,674,574 A | 10/1997 | Atwell et al. | |
| 5,820,678 A | 10/1998 | Hubert et al. | |
| 6,270,839 B1 | 8/2001 | Onoe et al. | |
| 6,660,328 B1 | 12/2003 | Dahmen et al. | |
| 6,701,066 B2 | 3/2004 | Sandhu | |
| 6,718,126 B2 | 4/2004 | Lei | |
| 6,740,586 B1 | 5/2004 | Wang et al. | |
| 6,772,072 B2 | 8/2004 | Ganguli et al. | |
| 6,797,337 B2 | 9/2004 | Dando et al. | |
| 6,839,505 B2 | 1/2005 | Sandhu | |
| 6,909,839 B2 | 6/2005 | Wang et al. | |
| 6,921,062 B2 | 7/2005 | Gregg et al. | |
| 7,050,708 B2 | 5/2006 | Sandhu | |
| 7,132,128 B2 | 11/2006 | Brcka | |
| 7,300,038 B2 | 11/2007 | Gregg et al. | |

(Continued)

FOREIGN PATENT DOCUMENTS

| | | |
|---|---|---|
| WO | WO 03 052160 | 6/2003 |
| WO | WO 2005 028702 | 3/2005 |

(Continued)

OTHER PUBLICATIONS

International Search Report and Written Opinion for PCT/IB2009/050112.

*Primary Examiner* — Keath Chen
(74) *Attorney, Agent, or Firm* — Patricia E. McQueeney

(57) ABSTRACT

An apparatus and method for holding a solid precursor in a sublimator such that the solid precursor can be vaporized for saturating a carrier gas. The apparatus may include alternating disks or shelves that form inner and outer passages, as well as spaces between the disks for fluidicly coupling the passages to create a winding, tortuous fluid flow path through the sublimator for optimizing solid vapor saturation. The method may include directing a carrier gas into a sublimation chamber, around the first shelf in the outer passage, over the first shelf in the space, around the second shelf in the inner passage, and back out of the sublimation chamber.

22 Claims, 8 Drawing Sheets

(56) References Cited

U.S. PATENT DOCUMENTS

| | | |
|---|---|---|
| 7,443,313 B2 | 10/2008 | Davis et al. |
| 2002/0009544 A1 | 1/2002 | McFeely et al. |
| 2004/0016404 A1 | 1/2004 | Gregg et al. |
| 2004/0083965 A1 | 5/2004 | Wang et al. |
| 2004/0261896 A1 | 12/2004 | Gregg et al. |
| 2005/0006799 A1 | 1/2005 | Gregg et al. |
| 2005/0019026 A1 | 1/2005 | Wang et al. |
| 2005/0056216 A1 | 3/2005 | Kuse et al. |
| 2005/0072357 A1 | 4/2005 | Shero et al. |
| 2005/0166847 A1 | 8/2005 | Derderian |
| 2006/0024439 A2 | 2/2006 | Tuominen et al. |
| 2006/0219168 A1 | 10/2006 | Brcka |
| 2008/0202426 A1 * | 8/2008 | Suzuki .......................... 118/726 |

FOREIGN PATENT DOCUMENTS

| | | |
|---|---|---|
| WO | WO 2005 072357 | 8/2005 |
| WO | WO 2005 113857 | 12/2005 |
| WO | WO 2006 067711 | 6/2006 |
| WO | WO 2006 101767 | 9/2006 |
| WO | WO 2008 028170 | 3/2008 |

\* cited by examiner

SOLID PRECURSOR SUBLIMATOR

CROSS-REFERENCE TO RELATED APPLICATIONS

The present application claims the benefit of U.S. Provisional Application No. 61/020,339 filed Jan. 10, 2008, and U.S. Provisional Application No. 61/093,960 filed Sep. 3, 2008, the disclosures of which are hereby incorporated herein by reference.

STATEMENT REGARDING FEDERALLY SPONSORED RESEARCH OR DEVELOPMENT

Not applicable.

FIELD OF THE INVENTION

This disclosure relates generally to the field of chemical vapor deposition, and more specifically to phase change methods and apparatus used in the sublimation of solid precursor materials. Still more particularly, the disclosure relates to an apparatus for vaporizing solid precursor materials while restraining the same.

BACKGROUND

With advancement in the semiconductor industry there is a need to utilize new precursor materials that will meet stringent film requirements. The precursors are used in wide-ranging applications for depositing semiconductor layers. For example, the solid precursors may include components for the barrier, high k/low k dielectric, metal electrode, interconnect, ferroelectric, silicon nitride, or silicon oxide layers. Additionally, the solid precursors may include components acting as dopants for compound semiconductors. Some of the new materials are in solid form at standard temperature and pressure and cannot be delivered directly to the semiconductor film deposition chambers for the manufacturing process. Exemplary precursor materials include those inorganic and organo-metallic compounds of Aluminum, Barium, Bismuth, Chromium, Cobalt, Copper, Gold, Hafnium, Indium, Iridium, Iron, Lanthanum, Lead, Magnesium, Molybdenum, Nickel, Niobium, Platinum, Ruthenium, Silver, Strontium, Tantalum, Titanium, Tungsten, Yttrium, and Zirconium. These materials generally have very high melting point and low vapor pressure, and must be sublimed within narrow temperature and pressure ranges prior to introduction to a deposition chamber.

Technologies have been developed for subliming solid precursor materials for semiconductor manufacturing processes. A solid sublimator system is conventionally used to produce solid vapor for deposition. Due to the variety of the solid precursors, with independent sublimation temperature and pressure ranges, a sublimator and delivery system is preferably capable of flexible operational parameters. Preferably, the sublimator is configured to vaporize the precursors at the desired temperature and pressure and to deliver the precursors without contamination to the deposition chamber.

Currently, there are several types of solid sublimators commercially available for the industry. In one application, the solid precursors are collected and freely piled inside a container compartment. The compartment is heated to an elevated temperature, and inert carrier gas is introduced into the compartment to carry the sublimed vapor phase downstream for film deposition. While cost effective, this application may result in carrier gas that is not saturated or a precursor vapor concentration that is not stable in the carrier gas. Further, the contact time between the carrier gas and the solid precursors are significantly reduced due to the consumption of the solid and the channeling flow through the agglomerated solid particles after operation for a period. As a means to compensate for this shortcoming, and for reducing contact time between carrier gas and solid, an agitation structure is installed inside the compartment to agitate the solid continuously. The agitation structure is designed to prevent the solid from agglomeration at operation condition, eliminate the channeling flow, and maintain sufficient contact of carrier gas with solid. However, the agitator fails to reduce contact time sufficiently, due to the consumption and/or the height of the precursor solids piled inside the container. Additionally, the movable part of the agitator decreases operational efficiency, increases maintenance downtime, and creates the concern of leakage and safety.

Another conventional application in the industry includes a solid precursor coated on the surfaces of various structures. For example, the solid precursor can be coated on cylinder surfaces that are set concentrically inside a heated container for sublimation. The surfaces may suffer non-uniformly distributed temperature profiles along the surfaces and, therefore, a non-stable sublimation of solid, resulting in a non-stable vapor concentration of precursor materials. Alternatively, the coated surface may be installed on a rotating shaft. The coated surface can be spot heated for smooth sublimation of solid precursors. However, the vaporization rate with this device is limited to low carrier gas flow rates. The carrier gas flow rate may not be feasible for industrial scale operational needs.

Recently, attempts to distribute solid materials on fluidicly coupled, heated surfaces inside a container or compartment have been implemented. In this application, the carrier gas flows through a number of passageways configured to couple the gas glow path between/through the heated surfaces. The carrier gas is routed from a lower heated surface, through the passageways to an upper layer or level. In certain applications, the carrier gas carries sublimed precursor vapor from a bottom surface of the heating surface to a top surface via the passageways. However, in order to maximize sublimation efficiency and surface area of the heated surface, a high number of passageways may be necessary. In these applications, the passageway diameters are minimized to maximize the heated surface area. The small diameter passages are easily clogged by small particles falling from the heating surface or unintended deposition of the precursor materials in the passageways.

Consequently, there is a need in the industry for a solid precursor sublimator for the sublimation of solid precursors with short contact time, high flow rate, low maintenance, for the production of a stable, saturated carrier gas.

SUMMARY

Disclosed herein is an apparatus for vaporizing a solid precursor. In an embodiment the apparatus includes a container including a sealable opening, a fluid inlet, a fluid outlet and an inner dimension, at least one first shelf having an outer dimension less than the container inner dimension to form an outer passage, and including an inner support with an outer dimension, at least one second shelf including an outer support positioned at the container inner dimension, and an opening greater than the outer dimension of the first shelf inner support, and wherein the first shelf is configured to form an overlapping vertical stack with the second shelf for positioning in the container, and a fluid flow path is established between the first shelf and the second shelf through the outer passage.

In a further embodiment, an apparatus for supporting a solid precursor in a sublimation chamber includes a first shelf including a top surface for supporting a solid precursor, a bottom surface, and a vertically oriented inner support, a second shelf including a top surface for supporting a solid precursor, a bottom surface, and a vertically oriented outer support circumferentially disposed thereon and thermally coupled to the sublimation chamber inner wall, an inner passage disposed between the second shelf and the first shelf inner support, an outer passage disposed between the first shelf and the second shelf outer support, and a horizontally disposed space between the first and second shelves establishing a fluid flow path between the inner and outer passages in the sublimation chamber.

In a further embodiment, an apparatus for vaporizing a solid precursor includes a container including a fluid inlet, a fluid outlet and an inner wall, a series of stacked disks including inner disks and outer disks, wherein each inner disk forms an outer fluid passage with the container inner wall and each outer disk forms an inner fluid passage with an inner support member, a space between each of the stacked disks for retaining a solid precursor, and a gas flow path from the fluid inlet, around the stacked disks in the inner and outer fluid passages, over the stacked disks in the spaces, and to the fluid outlet.

In a further embodiment, a method of depositing films includes loading a solid precursor onto a first shelf, wherein the first shelf comprises annular slots for retaining the solid precursor, loading a solid precursor onto a second shelf, wherein the second shelf comprises annular slots for retaining the solid precursor, vertically stacking the first shelf and the second shelf with a separation space therebetween, positioning the stacked first shelf and second shelf in a sublimation chamber, the sublimation chamber having a carrier gas inlet and a carrier gas outlet, sealing the sublimation chamber, heating the sublimation chamber, flowing the carrier gas from the inlet, around the first shelf through an outer passage, over the first shelf and the solid precursor thereon through the separation space, around the second shelf through an inner passage, over the second shelf and the solid precursor thereon, and into the outlet, directing the solid vapor saturated gas to a deposition chamber, and depositing the solids from the vapor.

The foregoing has outlined rather broadly certain features and technical advantages of some embodiments of the present disclosure in order that the detailed description of the disclosure that follows may be better understood. These and additional embodiments, features and potential advantages will be apparent in the following detailed description.

BRIEF DESCRIPTION OF THE DRAWINGS

For a detailed description of the preferred embodiments of the disclosure, reference will now be made to the accompanying drawings in which.

DETAILED DESCRIPTION

In an embodiment, a solid precursor sublimator is described. Generally, the sublimator comprises a heated cylindrical chamber configured for the flow of a gas therethrough. The chamber comprises at least one shelf, or annular disk, disposed therein and configured for the support of a solid material. The shelf may be configured with annular openings between a centrally disposed support and/or the wall of the chamber, such that gas may flow therethrough. Further, the chamber is configured to flow the gas over the top surface of the shelf, in contact with the solid material supported thereon. In certain instances, the shelf may comprise a closure member, lid, or porous plate configured to retain the solid material on the shelf physically. The closure member is configured to permit the flow of gas therethrough, and in contact with the supported solid material.

Figure 1:
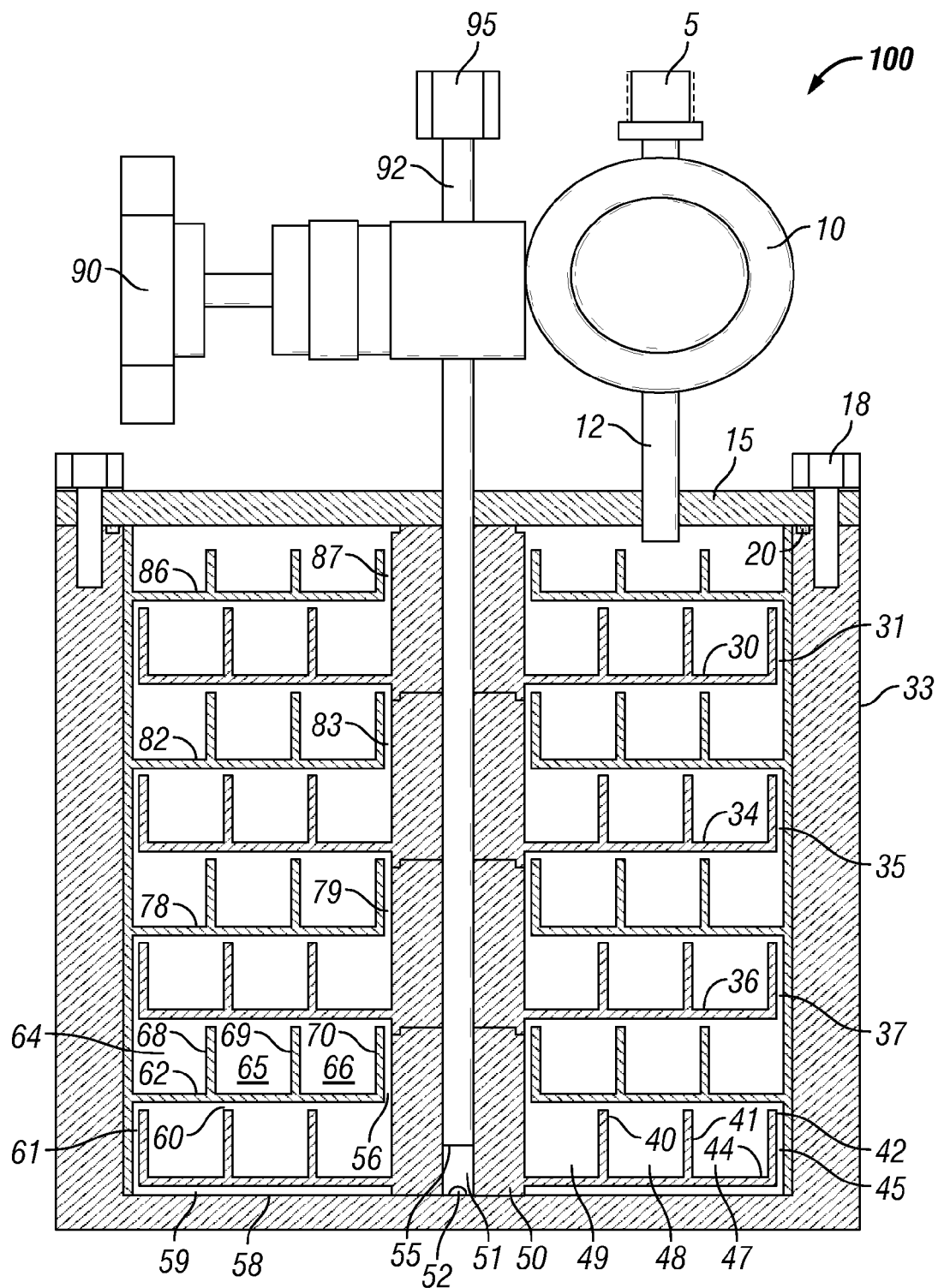
FIG. 1 illustrates a sublimator for subliming solid precursors comprising alternating, annular disks according to an embodiment of the disclosure.

FIG. 1 shows an embodiment of a solid precursor sublimator 100 for subliming a solid precursor. The solid precursors comprise any inorganic and/or organic chemical compounds, such as, aluminum, barium, bismuth, chromium, cobalt, copper, gold, hafnium, indium, iridium, iron, lanthanum, lead, magnesium, molybdenum, nickel, niobium, platinum, ruthenium, silver, strontium, tantalum, titanium, tungsten, yttrium, or zirconium compounds. For example, the hafnium compounds may comprise hafnium tetrachloride or tetrakis dimethylaminohafnium, without limitation. Further, the solid precursors may comprise any material known to one skilled in the art to produce high-k films, low-k films, metal films, semiconductor films, inter-layers, dielectric layers, and dopants, without limitation.

An external heater, not shown, is used to provide heat to the sublimator. The external heater is coupled to the sublimator, and/or any internal components of the sublimator by any means known to one skilled in the art. For instance, the external heater could be an electric heating ribbon and/or band to provide sufficient heat to the container. The heater may comprise any understood by an artisan to be capable of heating the sublimator and/or internal components. In certain instances, the external heater is configured for maintaining an elevated temperature from ambient to about 500° C., in some instances to about 300° C. The external heater is capable of providing the needed sublimation heat for extended operations. In operation, the temperature is maintained depending on the solid precursor materials to be sublimed.

The sublimator 100 is configured as a conduit, or contact vessel, for a carrier gas. The carrier gas is maintained at a flow rate between about 0 liters/min to 5 liters/min; alternatively, the flow rate is between about 0 liters/min to 2 liters/min. The carrier gas is any inert gas including nitrogen, helium, argon, xenon, or others without limitation, and depending on the film deposition process. In certain applications, the carrier gas is a reactive gas such as NO, $NO_2$, CO, $CO_2$, and others, without limitation.

The sublimator 100 comprises a container 33. Container 33 is typically a cylindrical container, and alternatively, container 33 may comprise any shape, without limitation. The container 33 is constructed of materials such as stainless steel, nickel and its alloys, quartz, glass, and other chemically compatible materials, without limitation. In certain instances, the container 33 is constructed of another metal or metal alloy, without limitation. In certain instances, the container 33 has an internal diameter from about 8 centimeters to about 55 centimeters and, alternatively, an internal diameter from about 8 centimeters to about 30 centimeters. As understood by one skilled in the art, alternate configurations may have different dimensions.

Container 33 comprises a sealable top 15, sealing member 18, and gasket 20. Sealable top 15 is configured to seal container 33 from the outer environment. Sealable top 15 is configured to allow access to the container 33. Additionally, sealable top 15 is configured for passage of conduits into container 33. Alternatively, sealable top 15 is configured to permit fluid flow into container 33. Sealable top 15 is configured to receive and pass through a conduit comprising a dip tube 92 to remain in fluid contact with container 33. Dip tube 92 having a control valve 90 and a fitting 95 is configured for flowing carrier gas into container 33. In certain instances, dip tube 92 extends down the center axis of container 33. Further, sealable top 15 is configured to receive and pass through a conduit comprising outlet tube 12. The carrier gas is removed from container 33 through the outlet tube 12. Outlet tube 12 comprises a control valve 10 and fitting 5. In certain instances, outlet tube 12 is fluidically coupled to a gas delivery manifold, for conducting carrier gas from the sublimator 100 to a film deposition chamber.

Container 33 and sealable top 15 are sealed by at least two sealing members 18; alternatively, by at least about four sealing members. In certain instance, sealable top 15 is sealed to container 33 by at least about eight sealing members 18. As understood by one skilled in the art, sealing member 18 releasably couples sealable top 15 to container 33, and forms a gas resistant seal with gasket 20. Sealing member 18 may comprise any suitable means known to one skilled in the art for sealing container 33. In certain instances, sealing member 18 comprises a thumbscrew.

As illustrated in FIG. 1, container 33 further comprises at least one disk disposed therein. The disk comprises a shelf, or horizontal support, for solid material. In certain embodiments, an interior disk 30 is disposed annularly within the container 33, such that the disk 30 includes an outer diameter or circumference that is less than the inner diameter or circumference of the container 33, forming an opening 31. Alternatively, an exterior disk 86 is disposed circumferentially within the container 33, such that the disk 86 comprises an outer diameter or circumference that is the same, about the same, or generally coincides with the inner diameter of the container 33. Exterior disk 86 forms an opening 87 disposed at the center of the disk. In further embodiments, a plurality of disks is disposed within container 33. In embodiments, the disks are stacked in an alternating fashion, wherein interior disks 30, 34, 36, 44 are vertically stacked within the container with alternating exterior disks 62, 78, 82, 86. In embodiments, interior disks 30, 34, 36, 44 extend annularly outward, and exterior disks 62, 78, 82, 86 extend annularly toward the center of container 33. As illustrated in the embodiment of FIG. 1, interior disks 30, 34, 36, 44 are not in physical contact with exterior disks 62, 78, 82, 86.

Figure 2B:
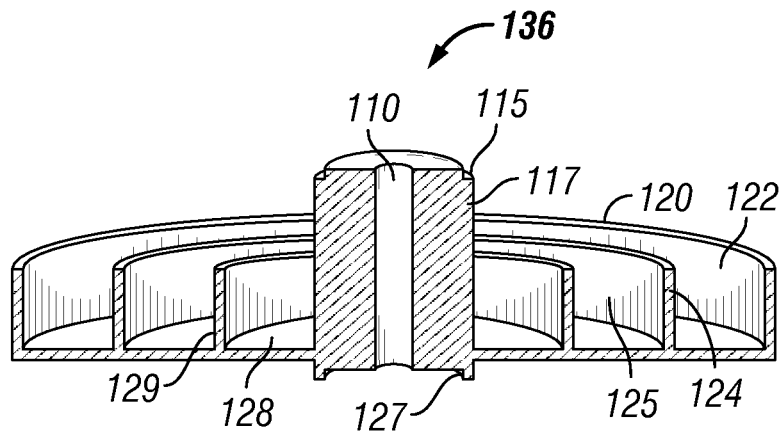
FIG. 2B illustrates an embodiment of an annular disk configured for stacking within a sublimator.
Figure 2A:
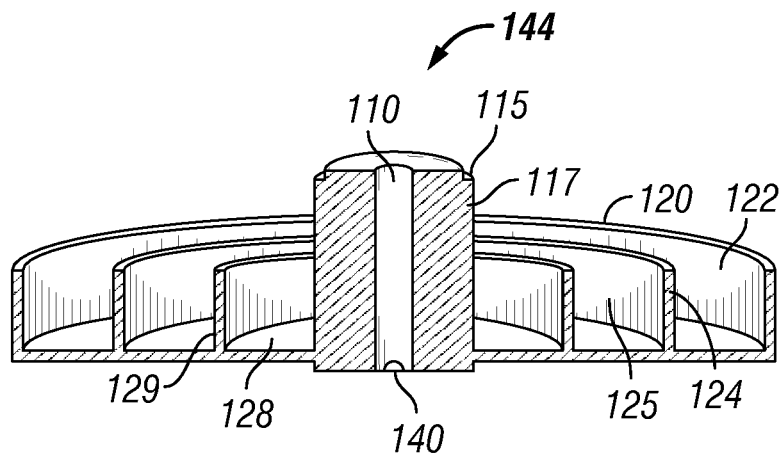
FIG. 2A illustrates an embodiment of an annular disk for a sublimator.

Referring now to FIGS. 2A and 2B, an interior disk 136 comprises support leg 117, channel 110, male coupler 115, concentric walls 120, 124, 129, and concentric slots 122, 125, 128. Interior disk 144 of FIG. 2A represents a disk configured to contact the bottom surface 58 of the container 33 in FIG. 1. Interior disk 136 of FIG. 2B includes a female coupler 127 and is configured to be stacked vertically upon interior disk 144. The interior disks 136, 144 may be constructed of stainless steel, nickel and its alloys, quartz, glass, and other chemically compatible materials; preferably, the interior disks 136, 144 are constructed of a metal or metal alloy.

For interior disks 136, 144, support leg 117 is configured to support vertically adjacent interior disks 136. Vertically adjacent interior disks 136 are joined by male coupler 115 and female coupler 127. Interior disks 136, 144 have outer diameters that are less than the inner diameter of the container 33, illustrated in FIG. 1. The interior disks have an outer diameter, to outer wall 120 of about 7 centimeters to about 54.5 centimeters and, alternatively, an internal diameter from about 7 centimeters to about 29.5 centimeters. Alternatively, the outer wall 120 of the interior disks 136, 144 is annularly disposed between about 0.3 centimeters and about 5 centimeters from the walls of container 33 to form the openings 31, 35, 37, 45 of FIG. 1.

The interior disks 136, 144 comprise at least one annular slot configured for receiving and retaining solid precursors. In certain embodiments, the interior disks 136, 144 comprise at least two annular or concentric slots, and in certain instances three or more slots on each disk for solid precursors. The width and depth of the slots may comprise alternate configurations, depending on the amount of solid precursor to be loaded into the sublimator. In certain configurations, the annular slot dimensions range from about 0.2 centimeters to about 10 centimeters in width and, alternatively, from about from about 0.5 centimeters to about 3 centimeters in width. Further, the annular slot dimensions range from about 0.2 centimeters to about 20 centimeters in depth, and, alternatively, from about 0.5 centimeters to about 4 centimeters in depth.

In embodiments, the interior disks 136, 144 are vertically stacked by inserting male coupler 115 into female coupler 127, such that support leg 117 is coupled between adjacent interior disks 136. The support legs 117 are the integrated parts of each interior disk 136, 144. Further, support legs 117 of the interior disks 136 are configured to maximize contact with adjacent interior disks 136, 144 to thermally couple adjacent interior disks by coupled support legs 117. Coupled support legs 117 between interior disks 136, 144 may form a virtual shaft. In embodiments, the support leg 117 comprises an outer diameter from about 0.25 centimeters to about 5 centimeters and, alternatively, an outer diameter from about 0.5 centimeters to about 3 centimeters. In further embodiments, the support leg 117 separates vertically adjacent interior disks 136, 144 by a vertical distance of between about 0.2 centimeters to about 25 centimeters and, alternatively, from about 0.4 centimeters to about 5 centimeters.

Furthermore, male coupler 115 and female coupler 127 align support legs 117 of adjacent interior disks 136, 144 and, consequently, align channels 110. Aligned channels 110 are configured to retain dip tube 92 as shown in FIG. 1. Further, the bottom interior disk 144 may not have female coupler 127. In certain instances, bottom interior disk 144 comprises at least one gas window 140 to vent carrier gas in dip tube 92 to container 33. In certain instances, bottom interior disk 144 comprises at least two gas windows 140, and preferably between about two gas windows 140 and about eight gas windows 140. Alternatively, the female coupler 127 may be configured as a gas window.

Figure 3:
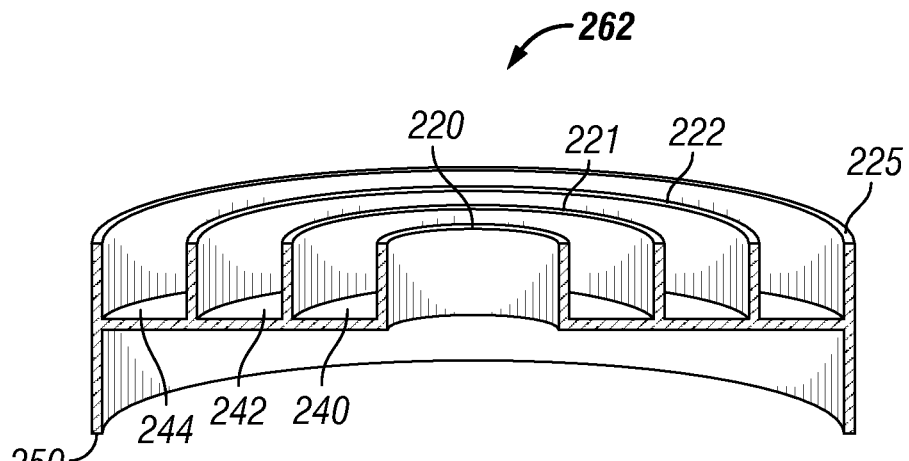
FIG. 3 illustrates an embodiment of an annular disk configured for alternating fitment and stacking within a sublimator.

Referring to FIG. 3, an exterior disk 262 comprises annular slots 240, 242, 244 that are formed by circular walls 221, 222, 225 and inner wall 220. Similar to the annular slots previously described for the interior disks 136, 144, the annular slots 240, 242, 244 of the exterior disk 262 are configured for receiving and retaining solid precursors. The annular slot dimensions range from about 0.2 centimeters to about 10 centimeters in width and, alternatively, from about from about 0.5 centimeters to about 3 centimeters in width. Further, the annular slot dimensions range from about 0.2 centimeters to about 20 centimeters in depth and, alternatively, from about 0.5 centimeters to about 4 centimeters in depth. The width and depth of the slots may comprise alternate configurations, depending on the amount of solid precursor to be loaded into the sublimator. The exterior disks 262 may be constructed of stainless steel, nickel and its alloys, quartz, glass, and other chemically compatible materials; preferably, the exterior disks 262 are constructed of a metal or metal alloy.

Lower wall 250 is extended vertically downward to support the exterior disks 262. In vertically adjacent exterior disks 262, the lower wall 250 is supported on outer wall 225 in order to stack exterior disks 262. Lower wall 250 separates exterior disks 262 by a vertical distance of between about 0.2 centimeters to about 25 centimeters and, alternatively, from about 0.4 centimeters to about 5 centimeters. Further, outer wall 225 and lower wall 250 of exterior disk 262 have an outer diameter that is about the same as the inner diameter of container 33 illustrated in FIG. 1. In certain instances, the outer diameter of exterior disk 262 is about 8 centimeters to about 55 centimeters and, alternatively, the outer diameter is about 8 centimeters to about 30 centimeters. In some embodiments, the outer wall 225 and lower wall 250 are in physical contact with container 33. The outer wall 225 and lower wall 250 are configured to maximize contact between exterior disk 262 and container 33 for enhanced thermal coupling.

Inner wall 220 of exterior disk 262 is configured to have an inner diameter greater than the support leg 117 outer diameter. In embodiments, the inner wall 220 comprises an inner diameter from about 0.3 centimeters to about 6 centimeters and, alternatively, an inner diameter from about 0.6 centimeters to about 4 centimeters. In certain instances, the inner wall 220 has an inner diameter that is about 0.3 centimeters to about 2 centimeters greater than the outer diameter of support leg 117 to form the openings 56, 79, 83, 87 of FIG. 1. For assembling, the support leg 117, as in FIG. 2, is partially fit into the opening created by inner wall 220, as in FIG. 3.

Referring again to FIG. 1, the assembled sublimator 100 comprises interior disks 30, 34, 36, 44 comprising aligned and coupled support legs 50, interior passage 51, concentric walls 40, 41, 42, and concentric slots 47, 48, 49. The interior disks 30, 34, 36, 44 are vertically stacked, and annularly oriented about the dip tube 92. Additionally, the sublimator comprises exterior disks 62, 78, 82, 86. As illustrated in FIG. 1, the exterior disks 62, 78, 82, 86 should be tightly fit into the container 33 for a good contact for conducting heat from the container 33 to the disks 62, 78, 82, 86. In these embodiments, the exterior disks 62, 78, 82, 86 are coupled to, or in physical contact with, the inner wall of the container 33. As illustrated, exterior disks 62, 78, 82, 86 and interior disks 30, 34, 36, 44 are stacked inside the container 33. When assembled in container 33 to form sublimator 100, the interior disks 30, 34, 36, 44 form outer gas passages 31, 35, 37, 45 between the assembled exterior disks 62, 78, 82, 86. Further, exterior disks 62, 78, 82, 86 form inner gas passages 56, 79, 83, 87 with the support legs of the interior disks 30, 34, 36, 44. The walls 40, 41, 42 of interior disks 30, 34, 36, 44 form the grooved slots for holding solid precursors. Exterior disks 62, 78, 82, 86 comprise walls 68, 69, 70 for holding solid precursors. During assembly, the solid precursors are loaded into the annular slots 47, 48, 49 of interior disks 30, 34, 36, 44 and annular slots 64, 65, 66 of exterior disks 62, 78, 82, 86.

Solid powders and/or granular particles of sizes less than about 1 centimeter, alternatively less than about 0.5 centimeter, and alternatively less than about 0.1 centimeter are loaded into the annular slots 47, 48, 49 of interior disks 30, 34, 36, 44 and annular slots 64, 65, 66 of exterior disks 62, 78, 82, 86. The solid precursors are loaded into the annular slots of each disk by any method suitable for uniform distribution of solid in the annular slots. Suitable methods include direct pour, using a scoop, using a funnel, automated measured delivery, and pressurized delivery, without limitation. Depending on the chemical properties of the solid precursor materials, loading may be conducted in a sealed environment. Additionally, inert gas atmosphere and/or pressurization in a sealed box may be implemented for those toxic, volatile, oxidizable, and/or air sensitive solids. Each disk could be loaded after setting the disk in the container 33. A more preferred procedure is to load the solid prior to setting the disk into container 33. The total weight of solid precursor loaded into the sublimator may be recorded by weighing the sublimator before and after loading process. Further, consumed solid precursor may be calculated by weighing the sublimator after the vaporization and deposition process.

Dip tube 92, having the control valve 90 and the fitting 95, is positioned in the center passage 51 of the aligned and coupled support legs of the interior disks 30, 34, 36, 44. Thus, dip tube 92 passes through interior passage 51 vertically toward bottom 58 of container 33. The dip tube end 55 is disposed proximal to the bottom 58 of container at/or above the gas windows 52. Gas windows 52 are disposed in bottom interior disk 44. The gas windows 52 are configured to allow carrier gas flow out of the dip tube 92. In the assembled sublimator 100, a gas passageway 59 is formed by the bottom surface 58 of the container 33, and the bottom interior disk 44. In certain instances, gas passageway 59 is configured to heat carrier gas.

In operation, the carrier gas is preheated prior to introduction into the container 33 via dip tube 92. Alternatively, the carrier gas can be heated while it flows through the gas passageway 59 by the bottom surface 58. Bottom surface 58 is thermally coupled and/or heated by an external heater consistently with the teachings herein. The carrier gas then passes through the gas passageway 45 that is formed by the outer wall 42 of the interior disk 44 and the outside wall 61 of the exterior disk 62. The gas passageway 45 leads to the top of the interior disk 44. The carrier gas continuously flows over the top of the solid precursors loaded into the annular slots 47, 48, and 49. Sublimed solid vapor from annular slots 47, 48, 49 is mixed with carrier gas and is flowed vertically upward through container 33.

Sequentially, the mixture of the carrier gas and solid vapor flows through the gas passageway 56 formed by the inside wall 70 of the exterior disk 62 and the supporting leg of the interior disk 44. The mixture is then flowed over the top of the exterior disk 62 to carry more sublimed solid vapor. The carrier gas will be mixed with the sublimed solid vapor, until saturated, as it flows over the annular slots 47, 48, 49 of interior disks 30, 34, 36, 44 and annular slots 64, 65, 66 of exterior disks 62, 78, 82, 86. The carrier gas flows continuously upward, through container 33 to the outlet tube 12. The gas flow path created by the alternating interior 30, 34, 36, 44 and exterior 62, 78, 82, 86 disks, and the alternating inner 56, 79, 83, 87 and outer 31, 35, 37, 45 passages or openings is a winding path offering multiple opportunities for the carrier gas to pick up solid vapors from the solid precursors positioned on the disks. Consequently, at the gas outlet 12, the carrier gas will be fully saturated with solid vapors. The gas flows through the outlet tube 12 to the control valve 10 and the fitting 5, and then to a gas delivery manifold disposed between the sublimator and a film deposition chamber.

Figure 4A:
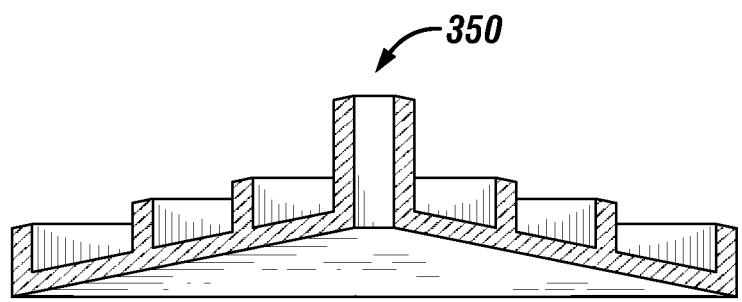
FIG. 4A illustrates an embodiment of a conical annular disk for a sublimator.
Figure 4B:
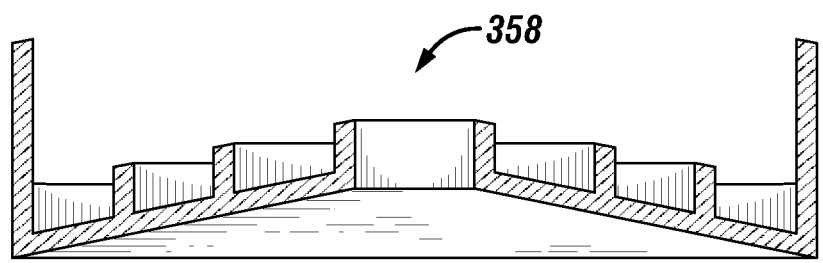
FIG. 4B illustrates an embodiment of a conical annular disk configured for alternating fitment and stacking within a sublimator.
Figure 5:
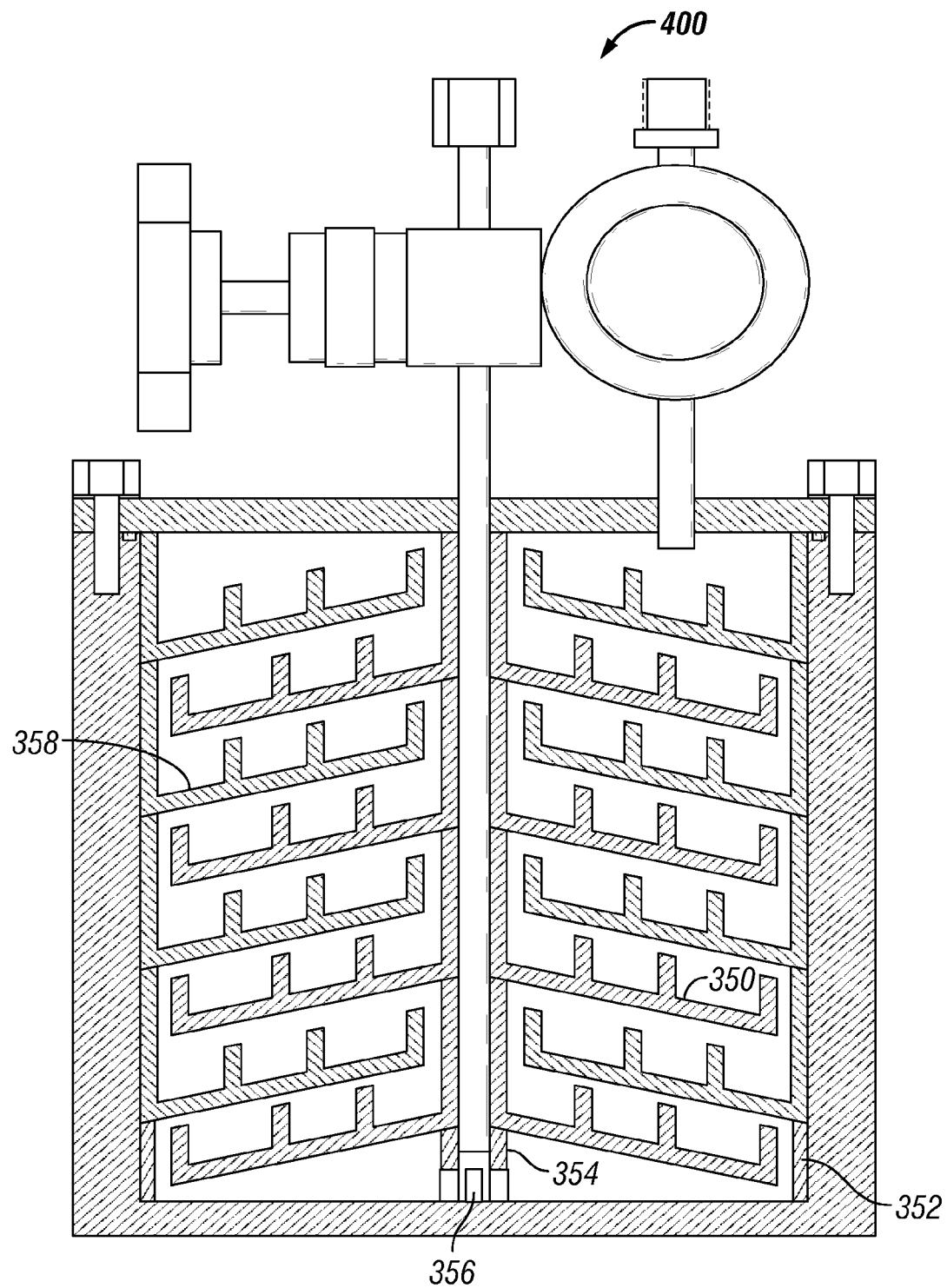
FIG. 5 illustrates an embodiment of a sublimator for subliming solid precursors comprising conical annular disks.

In alternative embodiments, as shown in FIGS. 4A and 4B, it can be envisioned that the interior disks 350 and exterior disks 358 may be constructed with a conical shape. In embodiments, interior disks 350 are configured to be sloped downward toward their outer edge and the inner wall of the container. Further, exterior disks 358 are configured to be sloped parallel to the interior disks 350. In further embodiments, the angle of the interior disks 350 and exterior disks 358 may be reversed, meaning the discs may be sloped upward toward their outer edge and the inner wall of the container. The conically shaped disks are assembled to form an alternative sublimator 400 as illustrated in FIG. 5. In certain instances, an interior spacer 354 is used to provide the correct spacing of the interior disk 350 over the gas window 356. Further, an exterior spacer 352 is used to provide the correct spacing of the exterior disk 358 over the interior disk 350. In certain instances, the sloped interior disks 350 and exterior disks 358 may alter gas flow rate through sublimator 400. Alternatively, the sloped interior disks 350 and exterior disks 358 improve properties of the sublimator 400, such as contact time, flow rate, and production of a stable, saturated carrier gas. As with previously described embodiments, the alternating inner disks 350 and outer disks 358 are positioned such that they create outer and inner openings or passages for a winding, tortuous fluid flow path through the sublimation chamber. Outer passages are formed between the inner disks 350 and the inner container wall and/or outer disk 358 support, while inner passages are formed between the outer disks 358 and the inner supports of the disks 350. The disk 350 inner supports align and couple to form the channel to receive the dip tube. The inner and outer passages create vertical fluid communication paths between and among the disks 350, 358, while the horizontal spaces between the disks 350, 358 allow lateral movement of the gases for an overall saturated vapor flow to the outlet. The disks 350, 358 also include concentric walls extending upward from the disks, as shown in FIG. 5, to assist in solid vapor saturation of the carrier gas.

Figure 6A:
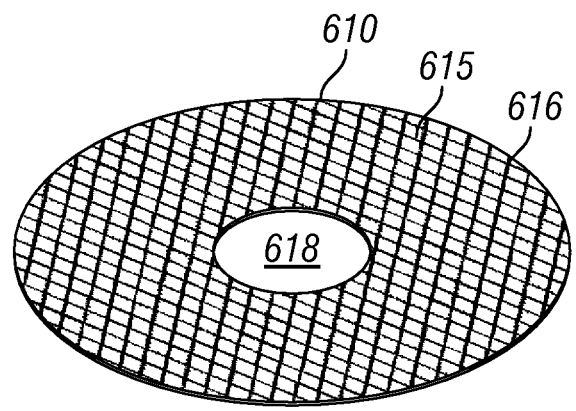
FIGS. 6A-6C illustrate various embodiments of precursor retention apparatuses for annular disks in a sublimator for subliming solid precursors.
Figure 6B:
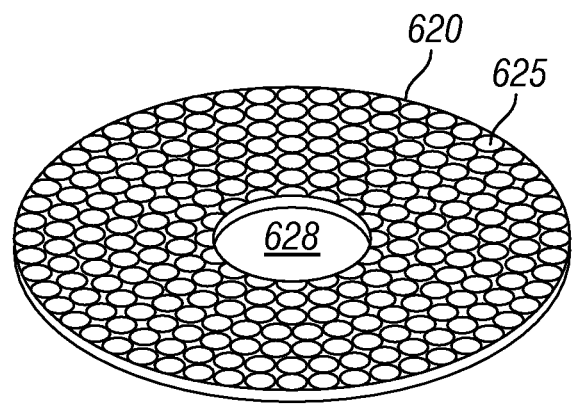
Figure 6C:
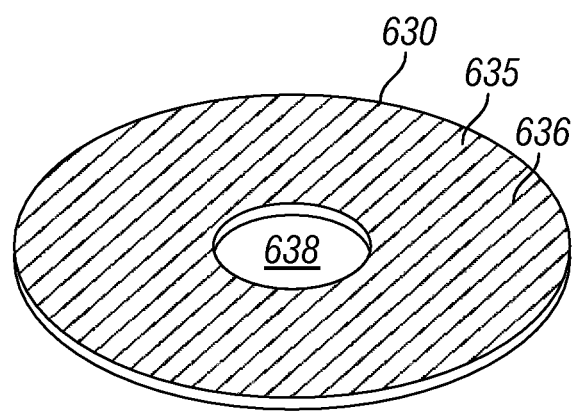
Figure 6D:
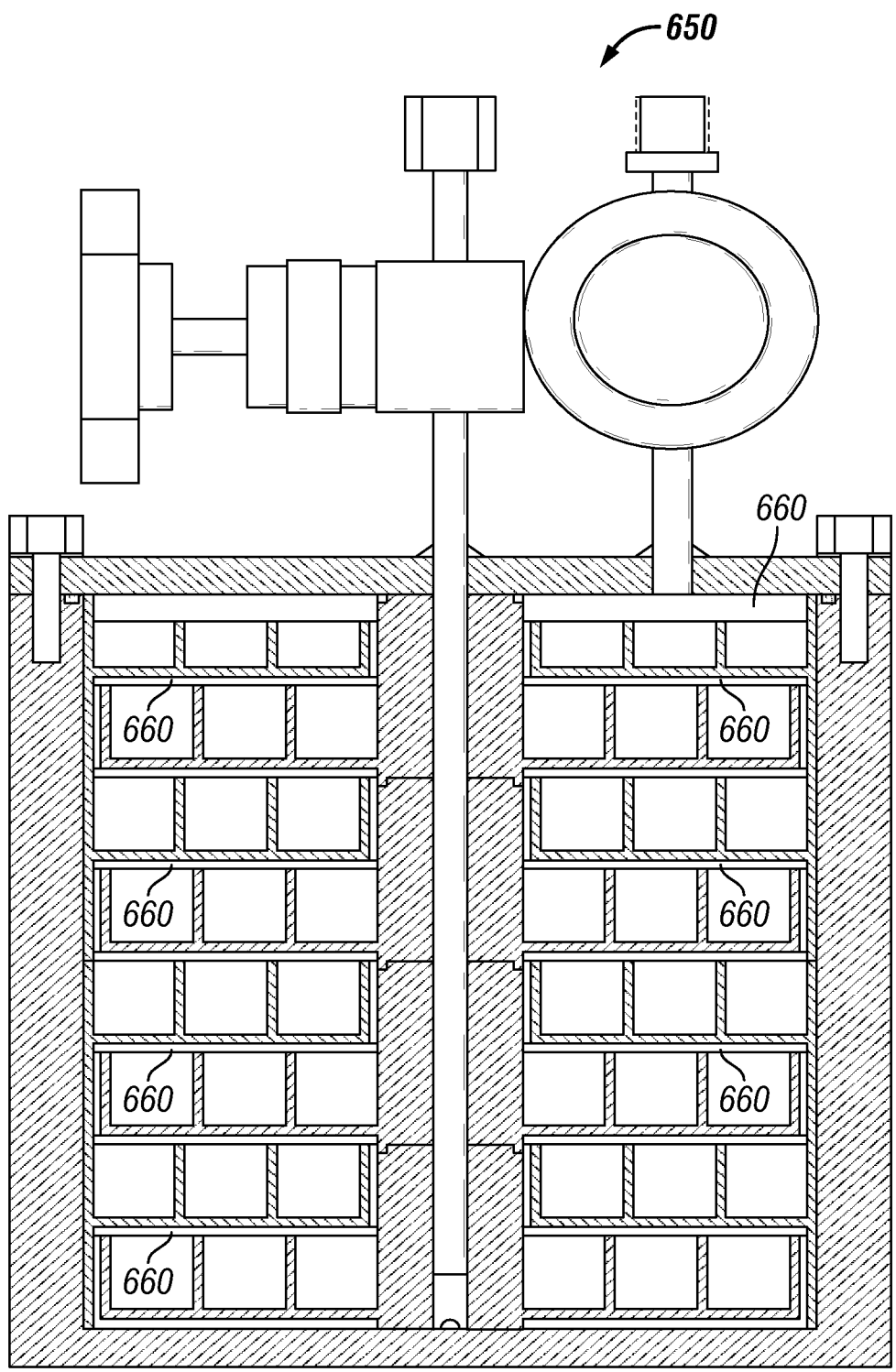
FIG. 6D illustrates an embodiment of a sublimator for subliming solid precursors comprising annular disks and precursor retention apparatuses.

FIGS. 6A-6C show embodiments of precursor retention apparatuses or porous plates configured to retain solid precursors on disk embodiments disclosed hereinabove. The plates are configured for application to the top surface of the disks, comprising annular grooves, within an alternative sublimator 650 as shown in FIG. 6D. The diameters of the plates are substantially equivalent to the diameters of the interior disks. In certain instances, the diameters of the porous plates are substantially equivalent to the diameters of the exterior disks, and/or the inner diameter of the container. The porous plates are configured for coupling to the disks. Alternatively, the porous plates are held in place by vertically adjacent disks in the sublimator 650. In these instances, the porous plates comprise a thickness that is about the distance from the top surfaces of the slot separation walls such as the walls 40, 41, and 42 and the bottom surface of the disk vertically adjacent as illustrated in FIG. 1.

FIG. 6A illustrates a first embodiment, comprising a mesh 610. In embodiments, the mesh 610 is a woven assembly of linear strands of material, or wires 615. Alternatively, the mesh is a bonded assembly of wires 615. The wires 615 may comprise a metallic material, such as stainless steel, carbon steel, and/or metallic alloys, without limitation. Further, wires 615 comprise a polymeric material, such as Teflon®, polyethylene, polypropylene, and/or another plastic, without limitation. Wires 615 may comprise a fibrous material such as thread, carbon fiber, or the like, without limitation. In certain instances, the wires 615 comprise a composite mesh manufactured from a combination of metallic, polymeric, and/or fibrous material. The mesh 610 of thin wires 615 forms openings 616 to allow gas and vapor to pass therethrough. The openings 616 are sized such that the solid precursor particles are restrained, or held in place, on the disks. The openings 616 are from about 10 micrometers to about 1000 micrometers across, and in certain embodiments, from about 50 micrometers to about 500 micrometers across. There is a cut opening 618 in the center of the plate to allow the support legs 117 of the small disks 136 and 144 as in FIG. 2 to pass through for assembling.

FIG. 6B illustrates another plate 620 having the similar function as the plate 610 in FIG. 6A. Alternatively, as illustrated in FIG. 6B, plate 620 is a perforated disk having holes 625. Carrier gas and sublimed solid vapor can easily flow through the holes 625. The plate 620 is configured to have a thickness that is smaller than about he distance from the top surfaces of the slot separation walls such as the walls 40, 41, and 42 and the bottom surface of the disk vertically adjacent as illustrated in FIG. 1. In certain instances, a support, a protuberance, a wedge, or the like, without limitation is constructed on the plate for interlocking fitment and retention in the distance space between vertically adjacent disks. Alternatively, the plate 620 comprises a thinned cross-section to form a small gap between the plate 620 top surfaces and the bottom surfaces of the vertically adjacent disk.

Another exemplary plate 630 is illustrated in FIG. 6C. The plate 630 is formed by fibers 635 in a random planar matrix. The plate 630 comprises a matrix of openings 636. The openings are formed through the randomly oriented and dispersed fibers 635, and are capable of gas and vapor flow therethrough. The fibers 635 may comprise any material previously discussed above, such as but not limited to stainless steel, carbon steel, and/or metallic alloys, Teflon®, polyethylene, polypropylene, and/or another plastic, thread, and carbon fiber. In certain instances, the fibers 636 comprise a composite mesh manufactured from a combination of metallic, polymeric, and/or fibrous material.

FIG. 6D shows the relative position of the porous plates 660 in the sublimator 650. As described hereinabove, the porous plates 660 are configured to restrain solid precursor particles on the disks. In certain instances, porous plates 660 may couple to disks by interlocking fitment, interference fitment, or alternatively, the porous plates 660 may be held in place by the vertically adjacent plates. In certain embodiments, the porous plates 660 are placed in the stack of disks during assembly of sublimator 650, without restraint, or coupling. In any configuration, porous plates 660 are configured to prevent the movement of particles, particulates, fines, solids, molecules, and/or other non-vapor phase solid precursors, to the gas outlet, while the saturated carrier gas flows around the alternating inner and outer disks through the inner and outer passages, and over the disks through the horizontal spaces between the disks.

Figure 7:
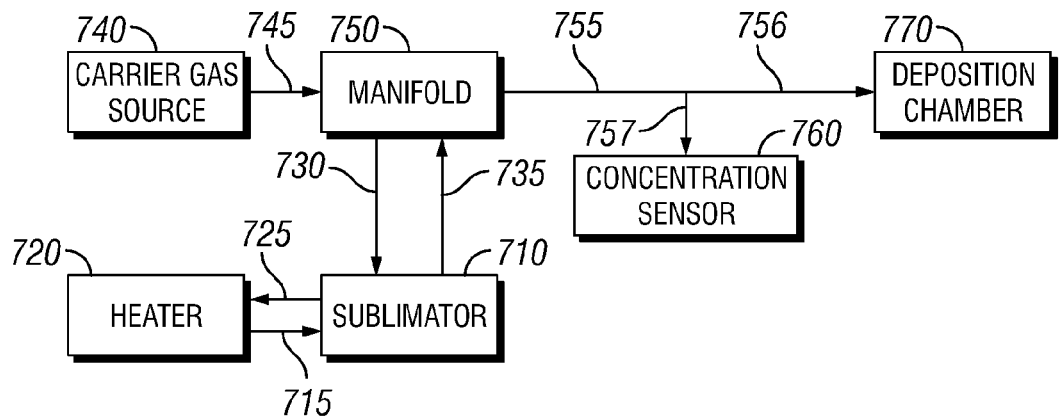
FIG. 7 illustrates a flow schematic for the operation of a sublimator comprising alternating annular disks.

FIG. 7 is a schematic drawing for the operational system of a solid precursor sublimator 710 in accordance with principles set forth herein. The sublimator 710 is configured for supplying vapor precursor to a reaction or deposition chamber 770 for film deposition. The sublimator 710 as described herein, and illustrated for example in FIG. 1, is installed in a delivery or deposition system. An external heater 720 provides the heat energy to the sublimator 710 through coupling 715. As described herein, the heater 720 may comprise any known to one skilled in the art, for example, an electric jacket heater, inductive heater, or circulated heated oil, without limitation. A temperature probe, monitor, or controller mounted on the sublimator 710, monitors the temperature therein, and sends a signal back to the heater system 720 through a communication coupling 725. The communication coupling 725 is configured for maintenance of a temperature, or temperature range within the sublimator 710. When the operation starts, a carrier gas such as nitrogen gas, helium gas, argon, or any other inert gas, as described herein, is supplied to the sublimator 710. The carrier gas source 740 is in fluid communication with the sublimator 710 through conduits 730, 745 and manifold 750. Conduit 745 and manifold 750 further comprise a series of control valves, regulators, purifier, mass flow controller, and any other components for regulated carrier gas flow. In certain instances, the carrier gas is preheated with an alternate heater apparatus, such as a heating tape in the manifold, before being introduced into sublimator 710. Precursor vapor sublimed in the sublimator saturates the carrier gas flowing through the sublimator 710. Carrier gas is saturated by flowing over the heated solid precursors contained on disks in the sublimator 710. Heated solid precursors produce the solid precursor vapors for deposition. The saturated vapor flows out of the sublimator 710 through gas outlet/conduit 735. Gas outlet/conduit 735 is in fluid communication with at least a portion of the manifold 750. The manifold 750 separates the carrier gas flow from the source 740, and from the gas outlet/conduit 735. The saturated vapors from sublimator 710 and gas outlet/conduit 735 are directed to at least one film deposition chamber 770 via conduits 755 and 756. The gas outlet/conduit 735 and manifold 750 are maintained at a raised temperature, or heat traced. In certain instances, the conduits 755 and 756 are also heat traced. The gas outlet/conduit 735, manifold 750, and conduits 755, 756 are maintained at least at the same temperature as the sublimator 710. In certain instances, this temperature elevation is suitable to avoid any solid precursor vapor deposition in the line. Alternatively, a temperature of about 5° C. to about 10° C. higher is maintained. Concentration sensor 760 is configured to monitor the concentration in the solid precursor vapor. The concentration sensor could be a sensor including a Fourier Transform Infrared (FTIR) meter, a mass spectrometer, a gas chromatograph, or other sensor such as a thermal conductivity detector for on line monitoring, without limitation. In the system, concentration sensor 760 is mounted at, or proximal to, conduits 755, 756. Alternatively, sensor line 757 is configurable for batch sampling the solid precursor vapor flow.

EXAMPLE 1

Figure 8:
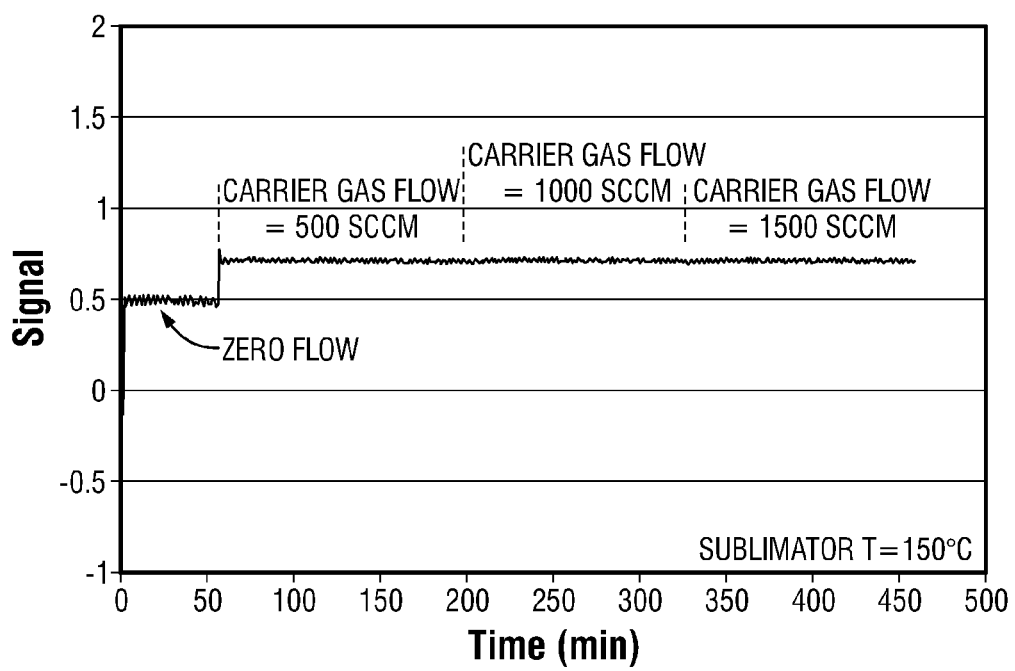
FIG. 8 illustrates operational data of a sublimator comprising alternating annular disks at varied gas flow rates.

As an example, solid hafnium tetrachloride powder was loaded into the sublimator shown in FIG. 1. The loaded sublimator is then installed into a solid precursor sublimation system as shown in FIG. 7. The sublimator was heated to a temperature 150° C., and maintained there. Compressed Nitrogen gas was used as the carrier gas. The carrier gas, delivered from a cylinder, was flowed through the manifold. The flow path included flow control valves, a regulator, a purifier for removing trace impurities, such as oxygen and water, and heated. The carrier gas was heated with an electric heat tape to the temperature 150° C. Prior to introduction into the sublimator, the heated nitrogen gas by-passed the sublimator, and was exhausted. A thermal conductivity detector was used to monitor the concentration of precursor vapor. The conductivity sensor monitored the initial nitrogen gas exhaust to establish a baseline vapor-concentration level. After the sublimator temperature was stabilized at 150° C., nitrogen (carrier) gas was introduced to sublimator. The heated carrier gas was run through the sublimator for carrying vapor hafnium tetrachloride to the deposition chamber. The vapor concentration was continuously monitored via the thermal conductivity sensor. Data was acquired for the carrier gas flow rates and measured in standard cubic centimeters per minute (sccm). The carrier gas was flowed through the sublimator at rates of about 500 sccm, 1000 sccm, and 1500 sccm, and the thermal conductivity sensor data recorded. The data graphed in FIG. 8 illustrates the sublimator of the present disclosure produces stable concentration of precursor vapor at different carrier gas flow rates.

EXAMPLE 2

Figure 9:
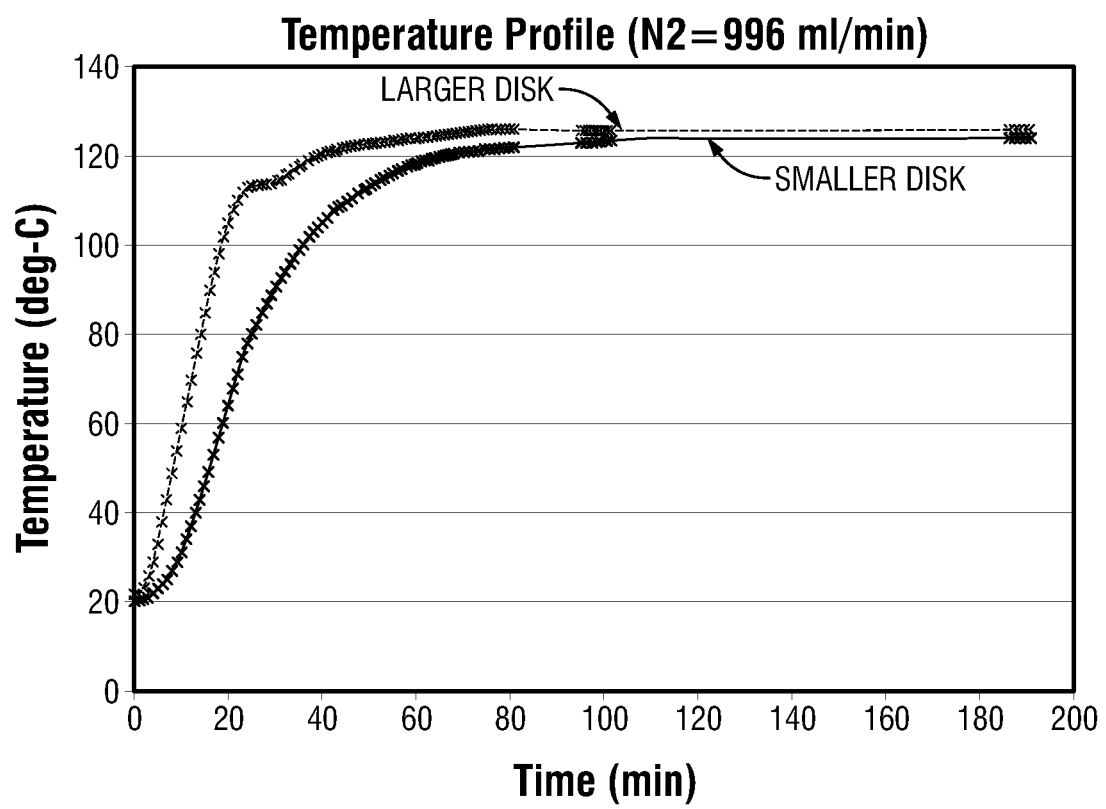
FIG. 9 illustrates the temperature distribution across the annular disks during the operation.

The sublimator shown in FIG. 5 was tested for temperature distribution profiles across the annular disks. The temperature profiles were determined with and without nitrogen gas flow of various flow rates across the interior (small) and exterior (large) disks. An external electric jacket heater was wrapped on the exterior wall of the container. FIG. 9 shows the smooth temperature distribution of the plates at a temperature of 122° C. during the operation.

We claim:

1. An apparatus for vaporizing a solid precursor comprising:
   a container including a sealable opening, a fluid inlet, a fluid outlet and an inner dimension;
   at least one first shelf having an outer dimension less than the container inner dimension to form an outer passage, and including an inner support with an outer dimension;
   at least one second shelf including an outer support positioned at the container inner dimension, and an opening greater than the outer dimension of the first shelf inner support; and
   wherein the first shelf is configured to form an overlapping vertical stack with the second shelf for positioning in the container, and a fluid flow path is established between the first shelf and the second shelf through the outer passage.

2. The apparatus according to claim 1, wherein the second shelf opening and the first shelf inner support form an inner passage communicating with the fluid flow path.

3. The apparatus according to claim 2, wherein a horizontal space between the first shelf and the second shelf extends the fluid flow path between the outer and inner passages.

4. The apparatus according to claim 3, wherein the fluid flow path communicates with the fluid inlet and the fluid outlet.

5. The apparatus according to claim 1, further comprising:
   horizontal spaces between each of the first and second shelves;
   inner passages between the second shelves and the shaft; and
   wherein the inner and outer passages extend the fluid flow path around the first and second shelves and the horizontal spaces extend the fluid flow path over the first and second shelves between the fluid inlet and the fluid outlet in the container.

6. The apparatus according to claim 1, wherein the inner channel receives a dip tube.

7. The apparatus according to claim 1, wherein the at least one second shelf opening is configured to receive and pass through the inner support of the at least one first shelf.

8. The apparatus according to claim 1, wherein the at least one first shelf and the at least one second shelf include a horizontal separation space therebetween, such that the fluid flow path extends around the at least one first shelf through the outer passage and over the at least one first shelf through the horizontal separation space.

9. The apparatus according to claim 1, wherein the at least one first shelf comprises at least one annular slot to support a solid precursor.

10. The apparatus according to claim 9, wherein the at least one annular slot comprises at least two annular walls.

11. The apparatus according to claim 1, wherein the container is coupled to a heater.

12. An apparatus for supporting a solid precursor in a sublimation chamber, comprising:
- a first shelf including a top surface for supporting a solid precursor, a bottom surface, and a vertically oriented inner support;
- a second shelf including a top surface for supporting a solid precursor, a bottom surface, and a vertically oriented outer support circumferentially disposed thereon and thermally coupled to the sublimation chamber inner wall;
- an inner passage disposed between the second shelf and the first shelf inner support;
- an outer passage disposed between the first shelf and the second shelf outer support; and
- a horizontally disposed space between the first and second shelves establishing a fluid flow path between the inner and outer passages in the sublimation chamber.

13. The apparatus according to claim 12, wherein the first shelf inner support comprises a coupler configured to stack vertically at least one additional first shelf.

14. The apparatus according to claim 13, wherein the second shelf outer support is configured to stack vertically at least one additional second shelf to form an overlapping vertical stack of the first and second shelves, and wherein a plurality of the inner passages, outer passages and horizontal spaces wind the fluid flow path around the stacked shelves in the sublimation chamber.

15. The apparatus according to claim 12, wherein the second shelf bottom surface comprises a centrally disposed opening configured to receive and pass through the first shelf inner support.

16. The apparatus according to claim 12, wherein the first shelf comprises concentric annular walls extending from the top surface and forming at least one annular slot for supporting the solid precursor.

17. The apparatus according to claim 16, wherein the annular walls extend into the horizontal space and do not contact the bottom surface of the adjacent second shelf.

18. The apparatus according to claim 12, wherein the second shelf comprises at least one annular slot disposed on the top surface for supporting the solid precursor.

19. The apparatus according to claim 12, further comprising:
- at least one retention plate mounted to the top surface of the first shelf and configured for retaining the solid precursor thereon.

20. The apparatus according to the claim 19, wherein at least two annular walls extend from the first shelf top surface to the at least one retention plate.

21. The apparatus according to claim 20, wherein the annular walls form at least one annular slot to support the solid precursor under the retention plate.

22. The apparatus according to claim 19, wherein the at least one retention plate comprises a porous material to retain the solid precursor and pass a saturated vapor.

* * * * *